United States Patent
Zillinger et al.

(10) Patent No.: US 10,444,286 B2
(45) Date of Patent: Oct. 15, 2019

(54) PROGRESSIVE CAVITY PUMP (PCP) MONITORING SYSTEM AND METHOD

(71) Applicant: Geo Pressure Systems Inc., Calgary (CA)

(72) Inventors: Friedrich Ernst Zillinger, Armstrong (CA); Jeffrey Alan Scott, Strathmore (CA)

(73) Assignee: GEO PRESSURE SYSTEMS INC. (CA)

( * ) Notice: Subject to any disclaimer, the term of this patent is extended or adjusted under 35 U.S.C. 154(b) by 50 days.

(21) Appl. No.: 15/642,930

(22) Filed: Jul. 6, 2017

(65) Prior Publication Data
US 2018/0017623 A1    Jan. 18, 2018

(30) Foreign Application Priority Data
Jul. 15, 2016 (CA) .................................... 2936219

(51) Int. Cl.
| | | |
|---|---|---|
| G01R 31/34 | (2006.01) | |
| F04C 14/28 | (2006.01) | |
| E21B 47/00 | (2012.01) | |
| F04C 2/107 | (2006.01) | |
| F04C 13/00 | (2006.01) | |

(52) U.S. Cl.
CPC .......... *G01R 31/34* (2013.01); *E21B 47/0007* (2013.01); *F04C 2/1071* (2013.01); *F04C 13/008* (2013.01); *F04C 14/28* (2013.01); *F04C 2240/81* (2013.01); *F04C 2270/11* (2013.01); *F04C 2270/80* (2013.01)

(58) Field of Classification Search
CPC ................................................... H02K 11/215
See application file for complete search history.

(56) References Cited

U.S. PATENT DOCUMENTS

| | | |
|---|---|---|
| 4,057,365 A | 11/1977 | Colmer |
| 4,968,934 A | 11/1990 | Robinet et al. |
| 5,666,050 A | 9/1997 | Bouldin et al. |
| 5,941,305 A | 8/1999 | Thrasher |
| 7,347,261 B2 | 3/2008 | Markel et al. |

(Continued)

FOREIGN PATENT DOCUMENTS

| | | |
|---|---|---|
| CA | 2231321 C | 6/2000 |
| CA | 2450766 A1 | 6/2005 |

(Continued)

OTHER PUBLICATIONS

Zenith Oilfield Technology Ltd., Brochure: "PCP Protection System" (Apr. 2008).

(Continued)

*Primary Examiner* — Noam Reisner
(74) *Attorney, Agent, or Firm* — Kirsten M. Oates; Rodman & Rodman LLP

(57) ABSTRACT

A pump monitoring system is provided, the pump including a rotor, and stator, the system including a magnetic field sensor to measure a magnetic field generated by a magnet positioned on a rod above the rotor; and a computer system configured to use the magnetic field to determine the rotor position. The magnetic field generated by the magnet can be used to determine characteristics of the pump including slipping and sticking, twist and twist differential, togging and wobble.

5 Claims, 11 Drawing Sheets

(56) References Cited

U.S. PATENT DOCUMENTS

| | | |
|---|---|---|
| 7,870,900 B2 | 1/2011 | Dorado et al. |
| 8,487,626 B2 | 7/2013 | Khan et al. |
| 8,957,674 B2 | 2/2015 | Genoud et al. |
| 2003/0015320 A1 | 1/2003 | Crossley |
| 2003/0107367 A1 | 6/2003 | Biester et al. |
| 2006/0000605 A1* | 1/2006 | Jordan ................ E21B 43/126 166/255.1 |
| 2013/0108488 A1 | 5/2013 | Chien et al. |
| 2013/0199776 A1 | 8/2013 | Amir |
| 2015/0060141 A1 | 3/2015 | Leuenberger et al. |

FOREIGN PATENT DOCUMENTS

| | | |
|---|---|---|
| CA | 2498984 C | 4/2015 |
| WO | 2015148871 | 10/2015 |

OTHER PUBLICATIONS

Geo Pressure Systems Inc., Brochure "FX-12 Advanced Downhole PCP Monitoring System" (Oct. 10, 2014).

* cited by examiner

PROGRESSIVE CAVITY PUMP (PCP) MONITORING SYSTEM AND METHOD

TECHNICAL FIELD

This invention relates to monitoring of downhole pumps, and more particularly to monitoring progressive cavity pumps.

BACKGROUND OF THE INVENTION

In oil and gas wells, downhole pumps are used to lift fluid to the surface. One type of downhole pump is called a progressive cavity pump ("PCP"), which is a screw type pump wherein a screw shaped rotor turns inside a stationary stator. The rotor is typically made from steel and the stator is typically a rubber lined steel tube. When the rotor turns, the fluid flows between the rotor and the stator and is forced up the tubing.

The PCP is driven from surface by a rod or rods. The rod is driven by a motor and gearbox called a head unit. The motor is typically electric and powered by a variable frequency drive ("VFD"). The rotational speed of the motor and pump is controlled by changing the frequency of the VFD, which changes the rate of fluid production from the well.

As the rotational speed and load on the pump changes, the rods shorten or lengthen, causing the position of the rotor to move up or down in the stator. For optimum performance of a PCP, the rotor should be vertically centered in the stator and should not protrude from the top or bottom of the stator. The rotational speed at the downhole rotor can vary cyclically or intermittently even with constant rotational speed at the head unit. The rotor may stop and start, move up and down, windup and release etc., which damages the pump and rods, shortens the life of the pump, and reduces pumping efficiency.

Pressure, temperature, and acceleration are routinely measured in wells and monitoring the rods in a downhole pump has been attempted before. Related art includes U.S. Pat. Nos. 4,968,934; 5,666,050; 8,487,626; U.S. Pat. Application Publication No. 2006/0000605, and U.S. Patent Application Publication No. 2015/0060141.

SUMMARY OF THE INVENTION

The system and method according to the invention monitor and measure the downhole performance of a PCP and thereby increase the life and efficiency of the pump.

The system according to the invention includes a magnetic field sensor to determine the magnetic field produced by a magnet attached to the rod so that as the rod spins the magnet remains in the detection range of the magnetic field sensor. The magnetic field can be used to determine the PCP rotor position and speed and other characteristics of the rotor. The system may include other sensors, including first and second pressure sensors to measure pump intake pressure and discharge pressure, respectively; first and second temperature sensors to measure temperature at the pump intake and at the discharge; first and second accelerometers (which may be x and z axis vibration sensors to measure horizontal and vertical vibration). Alternatively the magnet and sensor may be positioned anywhere along the rods, or any other rotating components such as the rotor, coupling or polish rod, and may be positioned at or close to, the surface. Multiple sensors can be positioned along the rods to obtain multiple measurements along the drive rod. Additional sensor types may also be present.

The system may be positionable within a tool mounted just above the pump rotor in the well. The tool may be clamped to the outside of the tubing and an electrical cable used to transmit power, readings and signals between the tool and the surface electronics.

Using the magnetic field detector, the analog waveform of the spinning magnet is captured and the speed of rotation and distance to the magnet determined. The waveform can be further analyzed to determine more complex characteristics, for example to determine if the pump rotor is sticking for any amount of time by measuring phase changes in the waveform. Additionally, a harmonic analysis can determine noise levels and destructive oscillations.

The magnetic waveform and the computed values can be displayed, stored, sent to a Supervisory Control And Data Acquisition (SCADA) system and used to control the pump. The magnetic data may be combined with downhole pressures/temperatures/vibrations and surface data to get a more complete performance analysis of the PCP pump.

A system for monitoring a pump including a rotor is provided, the system including: a magnetic field sensor to measure a magnetic field generated by a magnet; and a computer system configured to use the magnetic field measurements to determine magnetic field readings and determine a characteristic of the pump, the characteristic comprising at least one of stick or slip; differential twist; wobble; and cogging. The computer system may be further configured to use the magnetic field readings to determine rotation speed of the rotor and a distance of the magnet to the magnetic sensor. The system may include a monitoring tool mounted above the rotor. The sensor may be connected to the computer system on the surface.

The magnet may be positioned on a rod above the rotor, such that the magnet produces the magnetic field detectable by the magnetic field sensor. The rotation speed may be determined by determining the frequency of the largest magnetic field reading or using amplitude readings from the magnetic field sensor. The distance may be calculated by using a polynomial calculation for the relationship between a magnetic field strength and the distance. The rotor position may be determined by applying a logarithmic relationship to a converted amplitude of a magnetic field signal from the magnetic field sensor.

The computer system may be configured to calculate a twist value by comparing: a number of rotor revolutions to a number of surface rotations over a time period. The computer system is further configured to calculate the differential twist value by taking the differential of the twist value over a second time period.

The computer system may be further configured to determine the stick or slip value by: calculating an average time for a rotation of the rotor; comparing the average time to a subsequent time for rotation of the rotor; setting a flag to indicate if the subsequent time is greater than or less than the average time; and using the flag to provide a measurement of frequency of rotor slippage or sticking.

The first flag may be set when the subsequent time is greater than the average time and a second flag may be set when the subsequent time is less than the average time. The measurement of frequency may be a percentage of the time the rotor is sticking or slipping. The percentage may be output to a SCADA system.

The system for monitoring a pump may further include a pressure sensor; a temperature sensor; and an accelerometer. The magnetic field sensor may include at least one analog output magnetic field sensor. The analog output sensor may be a tunnel magnetoresistance sensor. The continuous analog magnetic waveform from the analog output magnetic field sensor may be used to determine a noise level associated with the pump or an occurrence of a destructive oscillation.

The characteristic may be used with output from the pressure sensor, temperature sensor and accelerometer to provide a pump condition value. The pump condition value is provided in real time.

The computer system may be further configured to display a difference signal comprising a waveform of the magnetic field compared to a perfect sine wave. The computer system may be configured to display the difference signal on a graphical display. The graphical display may be a circular display.

The cogging characteristic indicates variations of rotation speed of the rotor in a single rotation. The determination of cogging includes performing a fast Fourier transform on readings of the magnetic field. The determination of cogging may further include determining a sum of first and second harmonic amplitudes of the transformed readings and determining, a sum of amplitudes of each harmonics greater than two. A value representing cogging may be determined by dividing the sum of first and second harmonic amplitudes by the sum of amplitudes of each harmonic greater than 2.

The wobble characteristic is an indication if the rotation of the rotor is off center. The determination of wobble may include performing a fast Fourier transform on readings of the magnetic field. The determination of wobble may include determining an amplitude of a first harmonic of the transformed readings. The determination of wobble may further include determining an amplitude of a second harmonic of the transformed readings. A wobble value may be determined by dividing the amplitude of a second harmonic by the amplitude of the first harmonic.

The determination of wobble may include determining a first value of an average of readings of the magnetic field. The determination of wobble may further include determining a second value of an average of maximum and mini readings over a time period. A wobble value may be determined by dividing the absolute value of second value subtracted from the first value, which is then divided by the second value.

The magnetic field sensor may be at the surface. The pump monitoring system may further include a sensor configured to determine rod height, the sensor configured to determine rod height positioned at the surface.

A processor-implemented method of monitoring a pump comprising a rotor is provided, the method comprising: measuring a magnetic field generated by a magnet using a magnetic field sensor; and using the magnetic field readings to determine a characteristic of the pump, the characteristic comprising at least one of: stick or slip; differential twist; wobble; and cogging.

The method may incorporate any or all, or any combination of, the above elements described in relation to the system for monitoring a pump provided above.

BRIEF DESCRIPTION OF DRAWINGS

Embodiments of the invention will now be described with reference to the accompanying drawings.

DETAILED DESCRIPTION

Figure 1:
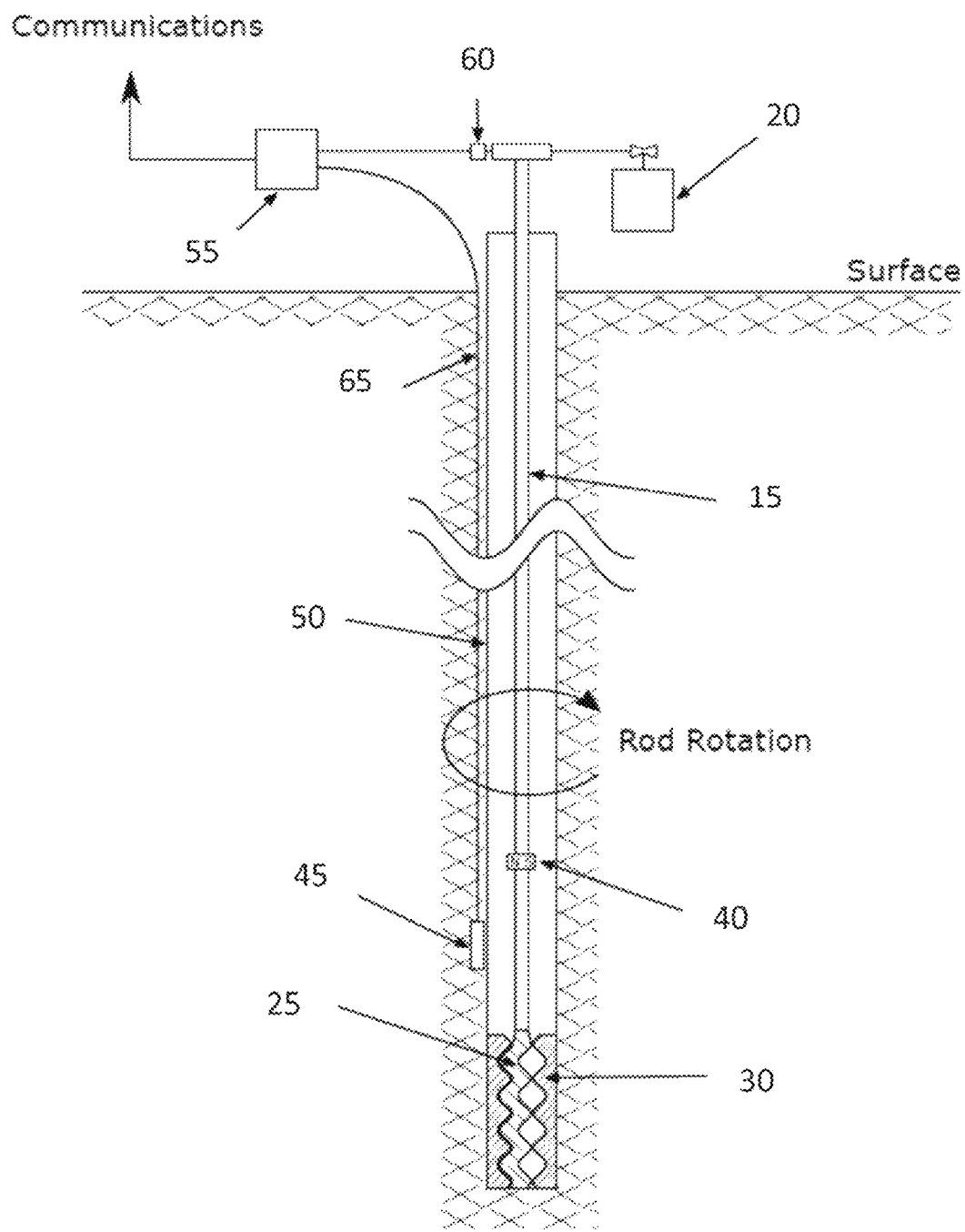
FIG. 1 is a side view of a downhole PCP system showing an embodiment of an environment of the system according to the invention.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

The algorithms and displays with the applications described herein are not inherently related to any particular computer or other apparatus operative in controller. Various general-purpose systems may be used with programs in accordance with the teachings herein, or it may prove convenient to construct more specialized apparatus to perform the required machine-implemented method operations. The required structure for a variety of these systems will appear from the description below. In addition, embodiments of the present invention are not described with reference to any particular programming language. It will be appreciated that a variety of programming languages may be used to implement the teachings of embodiments of the invention as described herein.

An embodiment of the invention may be implemented as a method or as a machine readable non-transitory storage medium that stores executable instructions that, when executed by a data processing system, such as a computer system, causes the system to perform a method. An apparatus, such as a computer system, can also be an embodiment of the invention. Other features of the present invention will be apparent from the accompanying drawings and from the detailed description which follows.

Terms

The term "invention" and the like mean "the one or lore inventions disclosed in this application", unless expressly specified otherwise.

The terms "an aspect", "an embodiment", "embodiment", "embodiments", "the embodiment", "the embodiments", "one or more embodiments", "some embodiments", "certain embodiments", "one embodiment", "another embodiment" and the like mean "one or more (but not all) embodiments of the disclosed invention(s)", unless expressly specified otherwise.

A reference to "another embodiment" or "another aspect" in describing an embodiment does not imply that the referenced embodiment is mutually exclusive with another embodiment (e.g., an embodiment described before the referenced embodiment), unless expressly specified otherwise.

The terms "including", "comprising" and variations thereof mean "including but not limited to", unless expressly specified otherwise.

The terms "a", "an" and "the" mean "one or more", unless expressly specified otherwise. The term "plurality" means "two or more", unless expressly specified otherwise. The term "herein" means "in the present application, including anything which may be incorporated by reference", unless expressly specified otherwise.

The term "e.g." and like terms mean "for example", and thus does not limit the term or phrase it explains.

The term "respective" and like terms mean "taken individually". Thus if two or more things have "respective" characteristics, then each such thing has its own characteristic, and these characteristics can be different from each other but need not be. For example, the phrase "each of two machines has a respective function" means that the first such machine has a function and the second such machine has a function as well. The function of the first machine may or may not be the same as the function of the second machine.

The term "readings" or signal", in relation to magnetic field, is the information gathered and output by a magnetic field sensor or magnetometer.

Where two or more terms or phrases are synonymous (e.g., because of an explicit statement that the terms or phrases are synonymous), instances of one such term phrase does not mean instances of another such term/phrase must have a different meaning. For example, where a statement renders the meaning of "including" to be synonymous with "including but not limited to", the mere usage of the phrase "including but not limited to" does not mean that the term "including" means something other than "including but not limited to".

Neither the Title (set forth at the beginning of the first page of the present application) nor the Abstract (set forth at the end of the present application) is to be taken as limiting in any way the scope of the disclosed invention(s) An Abstract has been included in this application merely because an Abstract of not more than 150 words is required under 37 C.F.R. section 1.72(b) and corresponding statutes in other jurisdictions. The title of the present application and headings of sections provided in the present application are for convenience only, and are not to be taken as limiting the disclosure in any way.

Numerous embodiments are described in the present application, and are presented for illustrative purposes only. The described embodiments are not, and are not intended to be, limiting in any sense. The presently disclosed invention(s) are widely applicable to numerous embodiments, as is readily apparent from the disclosure. One of ordinary skill in the art will recognize that the disclosed invention(s) may be practiced with various modifications and alterations, such as structural and logical modifications. Although particular features of the disclosed invention(s) may be described with reference to one or more particular embodiments and/or drawings, it should be understood that such features are not limited to usage in the one or more particular embodiments or drawings with reference to which they are described, unless expressly specified otherwise.

No embodiment of method steps or product elements described in the present application constitutes the invention claimed herein, or is essential to the invention claimed herein, or is coextensive with the invention claimed herein, except where it is either expressly stated to be so in this specification or expressly recited in a claim.

The invention can be implemented in numerous ways, and elements of the invention may be implemented as a process, an apparatus, a system, a computer readable medium such as a computer readable storage medium or a computer network wherein program instructions are sent over optical or communication links. In this specification, these implementations, or any other form that the invention may take, may be referred to as systems, techniques, processes, methods or algorithms. A component such as a computer system, processor or a memory described as being configured to perform a task includes both a general component that is temporarily configured to perform the task at a given time or a specific component that is manufactured to perform the task. In general, the order of the steps of disclosed processes may be altered within the scope of the invention.

The following discussion provides a brief and general description of a suitable computing environment in which various embodiments of the system may be implemented, for example, which may be present on a controller. Although not required, embodiments will be described in the general context of computer-executable instructions, such as program applications, modules, objects or macros being executed by a computer. Those skilled in the relevant art will appreciate that the invention can be practiced with other computer system configurations, including hand-held devices, multiprocessor systems, microprocessor-based or programmable consumer electronics, tablets, smart phones, personal computers ("PCs"), network PCs, mini-computers, mainframe computers, and the like. The embodiments can be practiced in distributed computing environments, such as a cloud, where tasks or modules are performed by remote processing devices, which are linked through a communications network. In a distributed computing environment, program modules may be located in both local and remote memory storage devices.

A computer system may be used as a server including one or more processing units, system memories, and system buses that couple various system components including system memory to a processing unit. Computer systems will at times be referred to in the singular herein, but this is not intended to limit the application to a single computing, system since in typical embodiments, there will be more than one computing system or other device involved. Other computer systems may be employed, such as conventional and personal computers, where the size or scale of the system allows. The processing unit may be any logic processing unit, such as one or more CPUs, digital signal processors ("DSPs"), application-specific integrated circuits ("ASICs"), etc. Unless described otherwise, the construction and operation of the various components are of conventional design. As a result, such components need not be described in further detail herein, as they will be understood by those skilled in the relevant an.

A computer system includes a bus, and can employ any known bus structures or architectures, including a memory bus with memory controller, a peripheral bus, and a local bus. The computer system memory may include read-only memory ("ROM") and random access memory ("RAM"). A basic input/output system ("BIOS"), which can form part of the ROM, contains basic routines that help transfer information between elements within the computer system, such as during startup.

The computer system also includes non-volatile memory. The non-volatile memory may take a variety of forms, for example a hard disk drive for reading from and writing to a hard disk, and an optical disk drive and a magnetic disk drive for reading from and writing to removable optical disks and magnetic disks, respectively. The optical disk can be a CD-ROM, while the magnetic disk can be a magnetic floppy disk or diskette. The hard disk drive, optical disk drive and magnetic disk drive communicate with the processing unit via the system bus. The hard disk drive, optical disk drive and magnetic disk drive may include appropriate interfaces or controllers coupled between such drives and the system bus, as is known by those skilled in the relevant art. The drives, and their associated computer-readable media, provide non-volatile storage of computer readable instructions, data structures, program modules and other data for the computer system. Although a computer system may employ hard disks, optical disks and/or magnetic disks, those skilled in the relevant art will appreciate that other types of non-volatile computer-readable media that can store data accessible by a computer system may be employed, such a magnetic cassettes, flash memory cards, digital video disks ("DVD"), Bernoulli cartridges, RAMs, ROMs, smart cards, etc. The non-volatile memory may be distributed via a network, for example using cloud based storage.

Various program modules or application programs and/or data can be stored in the computer system memory. For example, the system memory may store an operating system, end user application interfaces, server applications, and one or more application program interfaces ("APIs").

The computer system memory may also include one or more networking applications, for example a Web server application and/or Web client or browser application for permitting the computer to exchange data with sources via the Internet, corporate intranets, or other networks as described below, as well as with other server applications on server computers such as those further discussed below. The networking application in the preferred embodiment is markup language based, such as hypertext markup language ("HTML"), extensible markup language ("XML") or wireless markup language ("WML"), and operates with markup languages that use syntactically delimited characters added to the data of a document to represent the structure of the document. A number of Web server applications and Web client or browser applications are commercially available, such those available from Mozilla, Google, and Microsoft. The operating system and various applications/modules and/or data can be stored on the hard disk of the hard disk drive, the optical disk of the optical disk drive and/or the magnetic disk of the magnetic disk drive.

A computer system can operate in a networked environment using logical connections to one or more client computers and/or one or more database systems, such as one or more remote computers or networks. A computer may be logically connected to one or more client computers and/or database systems under any known method of permitting computers to communicate, for example through a network such as a local area network ("LAN") and/or a wide area network ("WAN") including, for example, the Internet. Such networking environments are well known including wired and wireless enterprise-wide computer networks, intranets, extranets, and the Internet. Other embodiments include other types of communication networks such as telecommunications networks, cellular networks, paging networks, and other mobile networks. The information sent or received via the communications channel may, or may not be encrypted. When used in a LAN networking environment, a computer is connected to the LAN through an adapter or network interface card (communicatively linked to the system bus). When used in a WAN networking environment, a computer may include an interface and modem or other device, such as a network interface card, for establishing communications over the WAN/Internet.

In a networked environment, program modules, application programs, or data, or portions thereof, can be stored in a computer for provision to the networked computers. In one embodiment, the computer is communicatively linked through a network with TCP/IP middle layer network protocols; however, other similar network protocol layers are used in other embodiments, such as user datagram protocol ("UDP"). Those skilled in the relevant art will readily recognize that these network connections are only some examples of establishing communications links between computers, and other links may be used, including wireless links. While in most instances a computer will operate automatically, where an end user application interface is provided, a user can enter commands and information into the computer through a user application interface including input devices, such as a keyboard, and a pointing device, such as a mouse. Other input devices can include a microphone, joystick, scanner, etc., as well as sensors, such as a magnetic field sensor. These and other input devices may be connected to the processing unit through the user application interface, such as a serial port interface that couples to the system bus, although other interfaces, such as a parallel port, a game port, or a wireless interlace, or a universal serial bus ("USB") can be used. A monitor or other display device may be coupled to the bus via a video interface, such as a video adapter. The computer can include other output devices, such as speakers, printers, etc.

The Environment

An embodiment of a typical environment of a system according to the invention is shown in FIG. 1. Rod 15 within tubing 50, is powered by motor 20, and is operable to rotate rotor 25 within stator 30 of a PCP. Magnet 40 is positioned on rod 15 above rotor 25. Downhole sensor assembly 45, which includes a magnetic field sensor, is attached to or integrated with tubing 50 and is in communication via cable 65 (although other communication means may be used, such as wireless) with a surface computer system, such as controller 55. Surface sensor assembly 60 is positioned above the surface and is also in communication with controller 55.

Downhole sensor assembly 45 may also include first and second pressure sensors to measure pump intake pressure and discharge pressure, respectively; first and second temperature sensors to measure temperature the pump intake and at the discharge, and first and second accelerometers (which may be x and z axis vibration sensors or theta sensors to measure horizontal and vertical vibration and twisting motion). Alternatively the magnet and sensor may be positioned anywhere along the rods, or any other rotating components such as the roto, couplings and polish rod, including at or close to, the surface, and in an alternative embodiment of the invention, the sensors in downhole sensor assembly 45 may be positioned at, or near the surface. Multiple sensors can be positioned along the rods to obtain multiple measurements along the drive rod. Additional sensor types may also be present.

Controller 55 may be a computer system configured to receive information from sensor assemblies 45, 60, process the information received, and output instructions to operate motor 20 and communicate information and reports along a network to other computer systems.

The magnetic field sensor samples the magnetic field produced by magnet 40 frequently, for example forty times a second, and receives raw magnetic field readings, also referred to as magnetometer readings. This data can be used to determine the location of magnet 40 and thus the speed of rotation. The information received is digitized and the digital data is sent via up a cable 65 to controller 55 for further processing by controller 55 or another computer system.

The magnetic field sensor includes one or more analog output magnetic field sensors, analog meaning that the signal output is proportional to the magnetic field. TMR sensors ma be used, but Hall effect or other similar types of magnetic sensors may also be used. The analog output signals of the magnetic field sensors are digitized and further processed by controller 55 or other computer systems. The computer systems may be downhole and/or at surface. In an embodiment of the invention, both downhole and surface computer systems are used and cable 65 in the well carries a digital telemetry signal between the computer systems.

Magnet 40 is mounted on rods 15 or the "drive shaft" above rotor 25 of a PCP. Magnet 40 may be any number of magnets with any physical orientations, although an embodiment may include two magnets in series, one on each side of the rod 15, which magnetically act as a single magnet.

When rods 15 are rotated to drive the pump, the distance from the magnetic field sensor to the magnet 40 is determined by measuring the amplitude of the AC signal from the magnetic field sensor and applying a conversion formula to determine the distance. Other useful information can be determined by processing the waveform. For example speed of rotation (RPM) and a rotation count can be calculated by determining the fundamental frequency.

Stick/Slip

A characteristic that can be measured using the system according to the invention is "stick" and "slip". Stick occurs when rotor 25 stops or slows in stator 30 and slip occurs when the rotor 25 releases after being stuck. Stick/slip is destructive to a PCP so monitoring is important. Stick/slip ranges from small variations in the rotation speed to complete stops and starts of rotor 25 for many rotations of the rods 15.

The analog magnetic waveform allows for determination of the angular position of rotor 25 during any part of the rotation, so stick and slip of any magnitude can be determined. Mathematically, stick and slip are changes in the phase of the waveform, and can be presented in units of turns, rotations, speed, frequency, and phase or as defined values to convey the stick and slip. The information can be presented in bar graphs, circle graphs, line graphs, histograms, etc.

Figure 4:
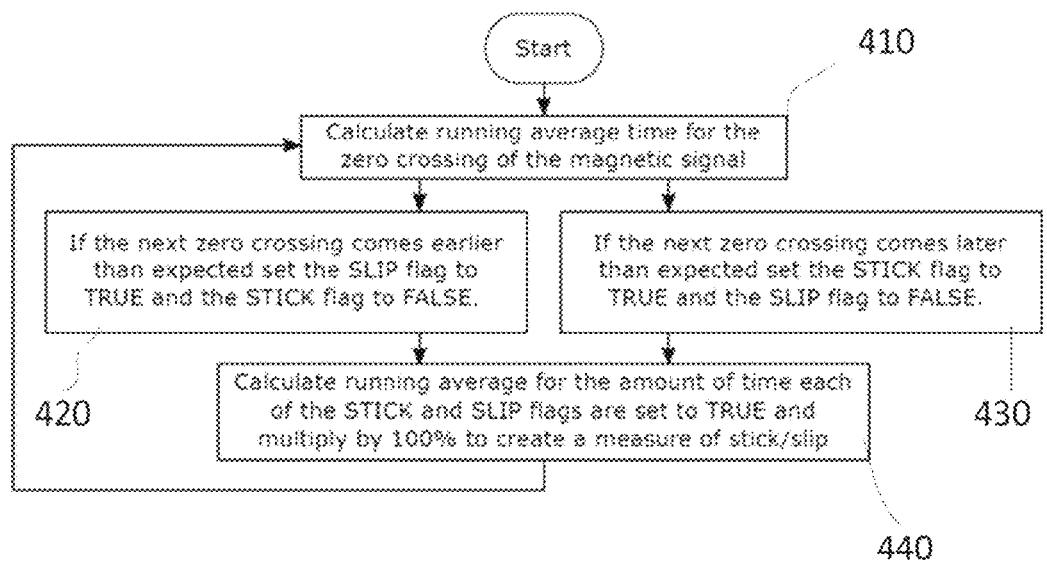
FIG. 4 is a flow chart showing the embodiment of a determination of the average stick and slip values of a PCP.
Figure 5A:
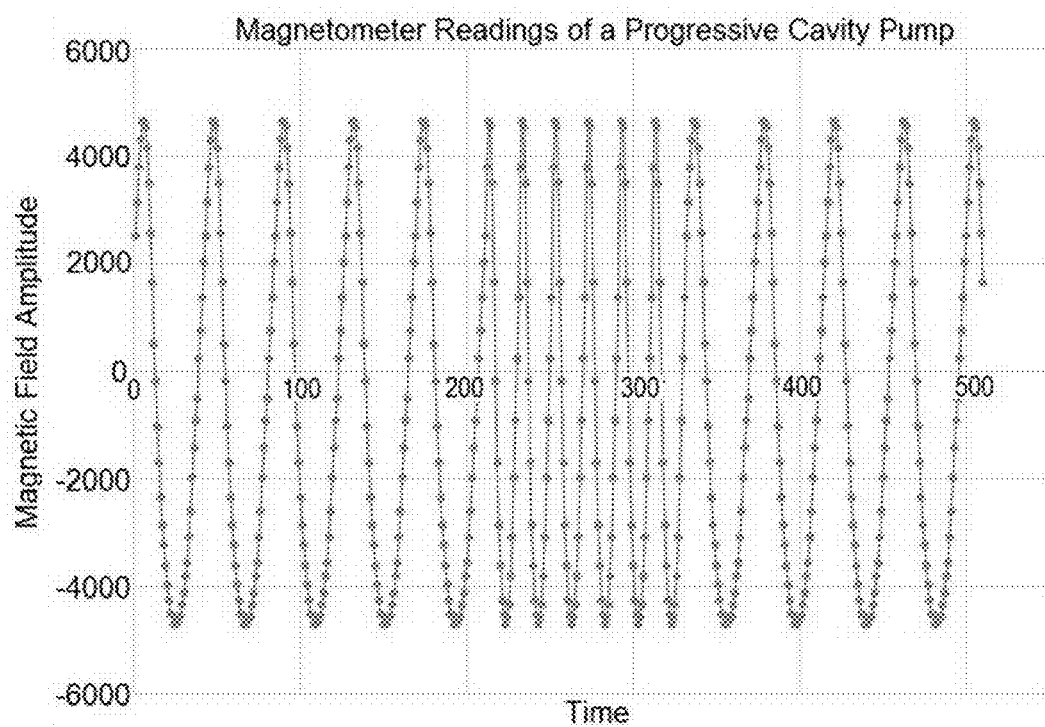
FIG. 5A is a graph showing a representative display of magnetic field readings of a PCP in which sticking and slipping is occurring.

Defined values to convey the stick and slip information may be a percentage slip and percentage stick which can then be defined as the percentage of time during one second that the rotor is either moving slower or faster respectively than the average speed, which can be used by a SCADA system. For example, with reference to FIG. 4, the running average time between each zero crossing of the magnetic field signal (for example as shown in FIG. 5A) is determined (step 410). If the following zero crossing is shorter than expected then the SLIP flag is set to true and the STICK flag to false (step 420). Alternatively, if the following zero crossing is later than expected the SLIP flag, is set to true and the STICK flag to false (step 430). The running average of the amount of time each of the STICK and SLIP flags are set to true is then multiplied by 100 to create a stick/slip value (step 440). The resulting slip/stick value is a measurement of the percentage of time that the rotor is slipping or sticking.

The slip/stick value (as may be calculated as described above) requires minimal data bandwidth and thus can be gathered and monitored by current SCADA systems. For instance, once each second the system can report to a SCADA system what percentage of that second the pump was sticking or slipping. The value can range from 0% to 100% of the second, and requires minimal data transmission throughput.

Alternatively, the raw magnetometer signal, as shown in FIG. 5A, may also be used for evaluating slip and stick. FIG. 5A shows the magnetic field generated by a pump running at variable speeds in a cyclical pattern. The rotation of the rotor is depicted by a continuous analog slip; stick signal. Although the raw signal may in some circumstances constitute too much data to continuously monitor and record, a continuous analog slip/stick signal can be: plotted to provide an accurate representation of the pattern of twist variations (slip/stick) experienced by the pump rotor downhole.

Figure 5B:
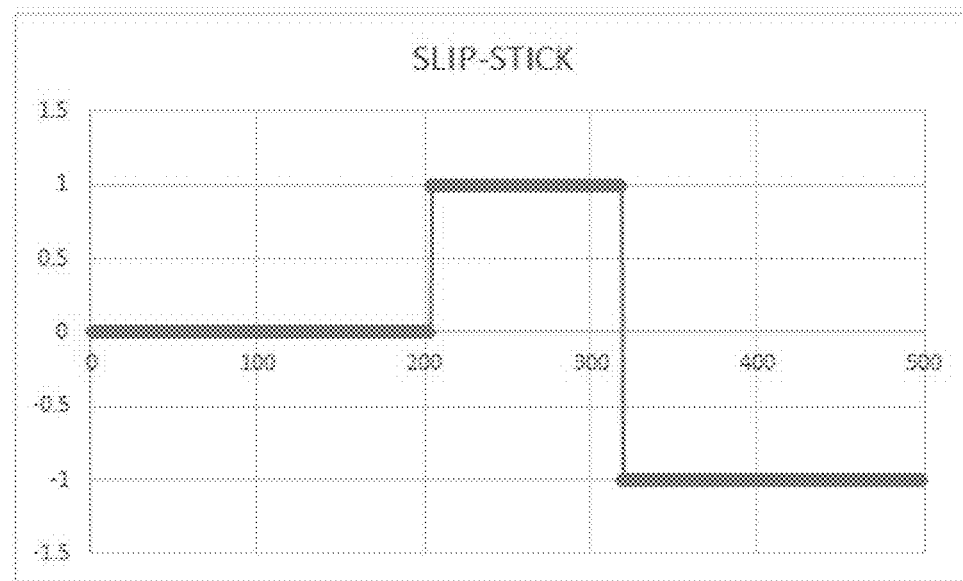
FIG. 5B is a graph showing a corresponding display of a slip-stick value as calculated according to the invention.

Alternatively, a waveform of the stick and slip flags may be displayed, an example of which is shown in FIG. 5B which corresponds to the raw signal shown in FIG. 5A. In this embodiment, when the signal is reading zero, the rotor is turning at its average speed, and the flags are off, so the line is in the middle. If the rotor is rotating slower than the average, the stick flag is set and the line goes up to 1. If the rotor is rotating faster than average, the slip flag is set and the line goes to −1. The STICK and SLIP flags will not occur concurrently, so they can be combined as a single line on a graph. The STICK and SLIP flag signal is much less data intensive than the continuous analog slip/stick signal. Also the percentages of STICK and SLIP can be displayed.

The RPM and rotation count every second also provide indications of slip and stick, but these only respond to larger amounts of slip and stick. A harmonic analysis may be performed on the magnetic field waveform to determine parameters like noise levels and destructive oscillations, which are also sensitive to the effects of slip and stick.

Further analysis of the magnetic field signal can be used to determine another characteristic, the exact phase were sticking occurs, which can be combined with the rotor 25 position calculation (which is based on the signal amplitude), to determine if rotor 25 is sticking in a consistent spot or in random spots. This is an indication as to whether the sticking is caused by external factors, like fluid phase changes, gas or sand which would cause random sticking, or internal factors, such as a Wing stator elastomer, which would cause non-random, or consistent sticking. Given the shape of rotor 15, non-random sticking exhibits a barber pole pattern of sticking as the position of the rotor moves up or down.

The magnetic field signal can be processed by comparing it to a perfect sine wave, and noting the difference which is when sticking or slipping occurs. In other words, the error signal, also known as difference signal, of a phase locked loop is determined. This difference signal can be recorded for each sample with the phase information from the perfect sign wave. The difference signal can also be enhanced with further waveform processing, including differentiation, and more complex pattern recognition like wavelet processing.

Figure 11:
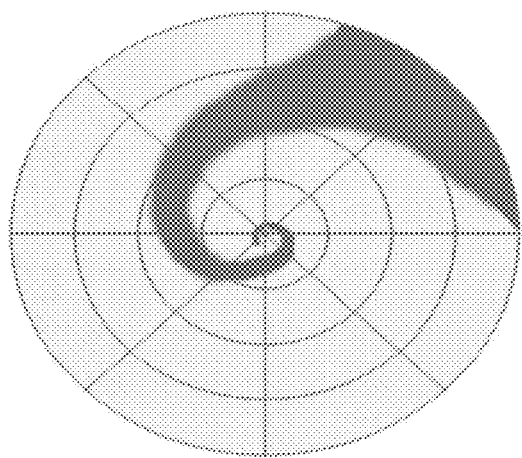
FIG. 11 is an embodiment of a round differential display according to invention.

The difference signal can be plotted on a circular display, similar to a radar display, an embodiment of which is shown in FIG. 11. The density of the display is determined by the amplitude of the balance signal, for example a signal where the difference is low would be grey, and an occurrence of sticking or slipping would have a darker or lighter density, respectively.

The angle of the waveform is the phase of the difference signal and the distance from the center of the display is the rotor 25 position data from the signal. As the continuous waveforms are plotted on this display, they create the impression of looking down a pipe, and if a spiral pattern appears in the image that indicates that rotor 25 is sticking within stator 30 in non-random spots. The contrast level is indicative of the severity of the sticking and slipping. The display may be further enhanced by adjusting the persistence of the display and by creating a video of the circular display over time. Alternatively, the difference signal can be displayed on a rectangular graph, which corresponds to an open unfolded stator 30. The difference signal may be sampled at a slower rate, for example once per second, where the maximum difference value during the last second and the corresponding phase angle are recorded.

Differential Twist

By counting the revolutions of the downhole rotor 25, and by counting the rotations on surface with a separate sensor the system can calculate twist, i.e. the difference in revolutions per minute (RPM) determined at the surface and RPM determined downhole.

Figure 2:
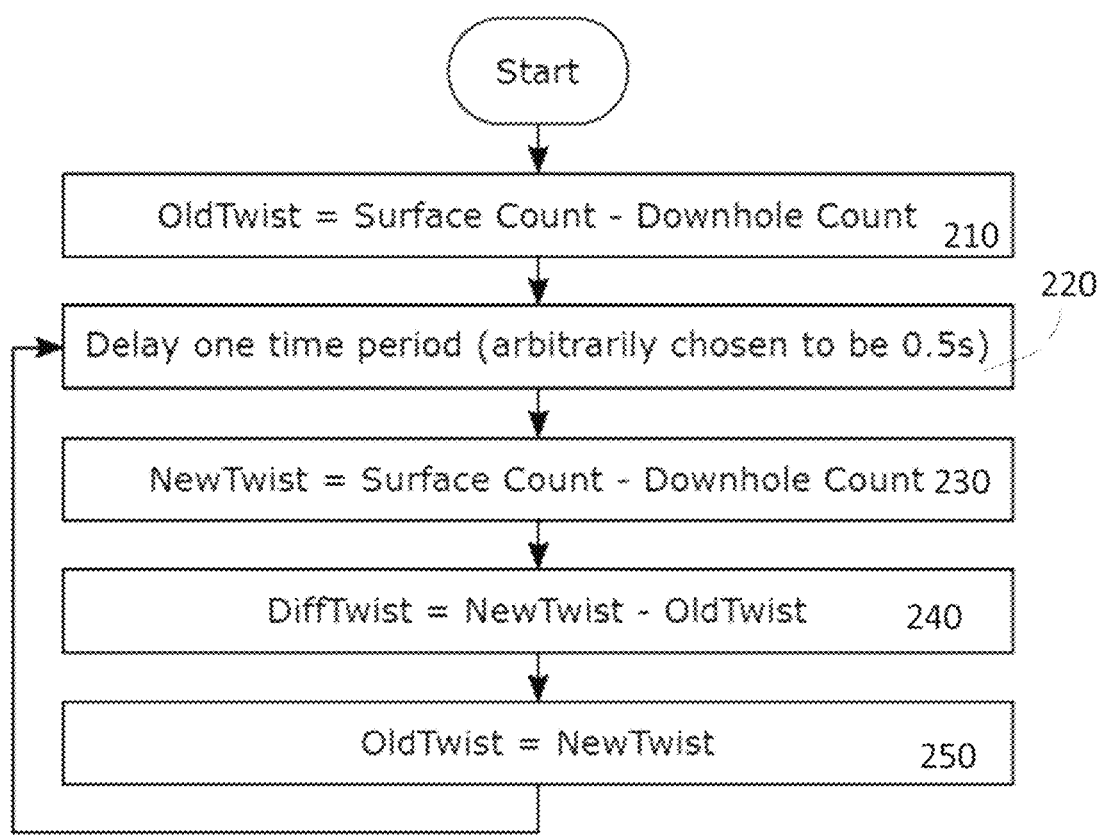
FIG. 2 is a flow chart showing an embodiment of the determination of a differential twist value according to the invention.
Figure 3:
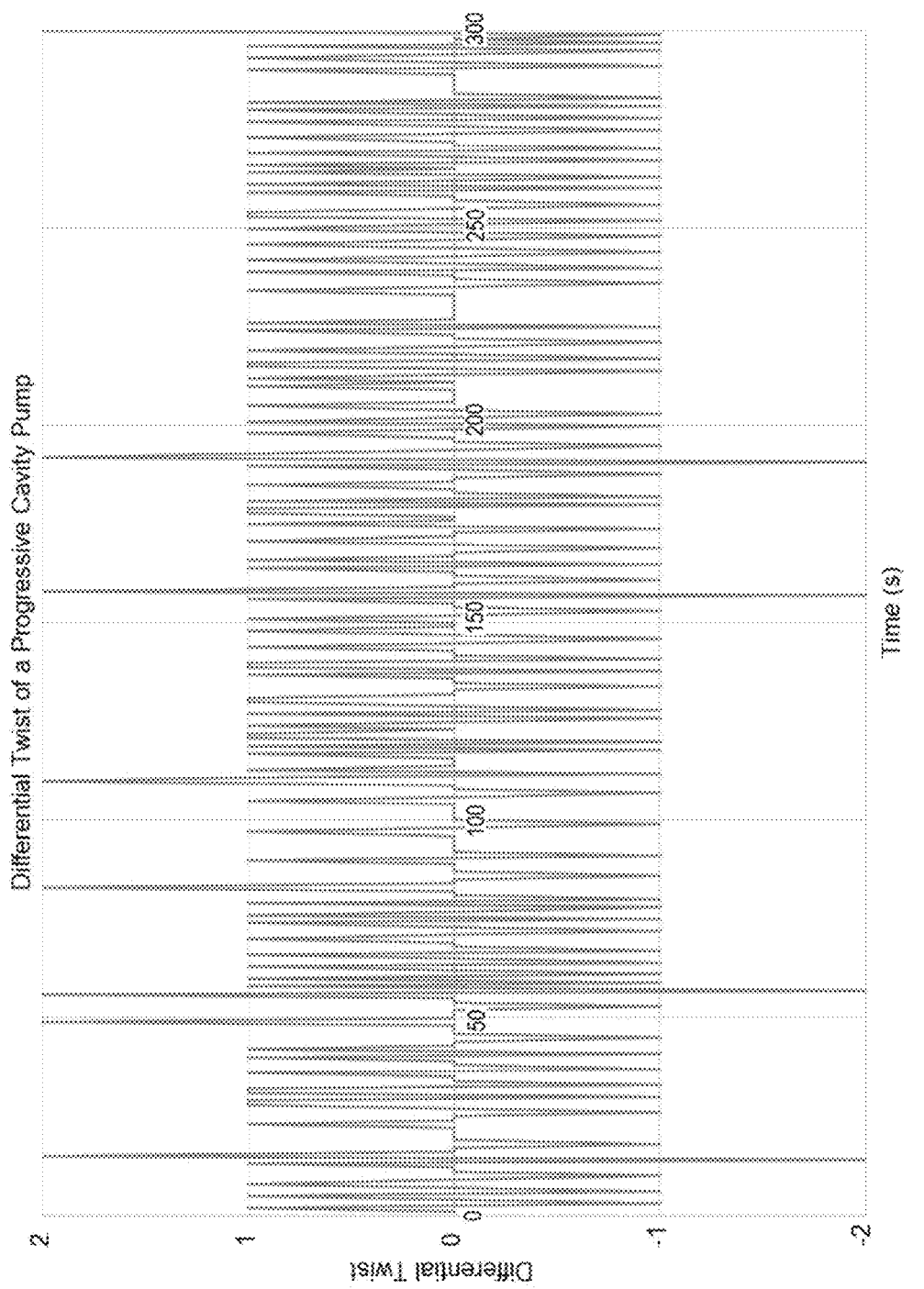
FIG. 3 is a graph showing a representative display of the differential twist of a PCP according to the invention.

The system according to the invention can also calculate a characteristic of differential twist by producing a differential twist value. As shown in FIG. 2, differential twist is calculated by taking the differential (i.e. rate of change) of the twist value. Differential twist has the advantage of being auto zeroing, and only showing a value when there is a variation in the twist. Variations in twist represent damaging downhole speed oscillations. The differential twist value is most effective when the pump is running quickly and is experiencing severe problems. An example of graph showing differential twist over time is shown in FIG. 3.

Referring to FIG. 2, the previous, or old twist value may be calculated by subtracting the downhole rotation count in a given period from the surface rotation count (step 210). An arbitrary delay period then passes, for example 0.5 seconds (step 220). A new twist value is then taken, subtracting the current downhole rotation count from the surface rotation count (step 230). The differential twist is then calculated as the previous twist value subtracted from the new twist value (step 240). The new twist value is then set as the previous, or old twist, value for the next calculation (step 250).

The computed values can be displayed, stored, sent to a SCADA system or used to control the pump. Controller 55 can use linear, non-linear, alarms, limits and exceptions, etc. to control the pump and alert operators. Finally the data derived from the magnetic waveform can be combined with other data such as downhole pressures/temperatures/vibrations derived from downhole sensor assembly 45, and surface data from surface sensor assembly 60 and motor 20 to provide a more complete picture of the performance of the PCP pump.

Wobble

Figure 8:
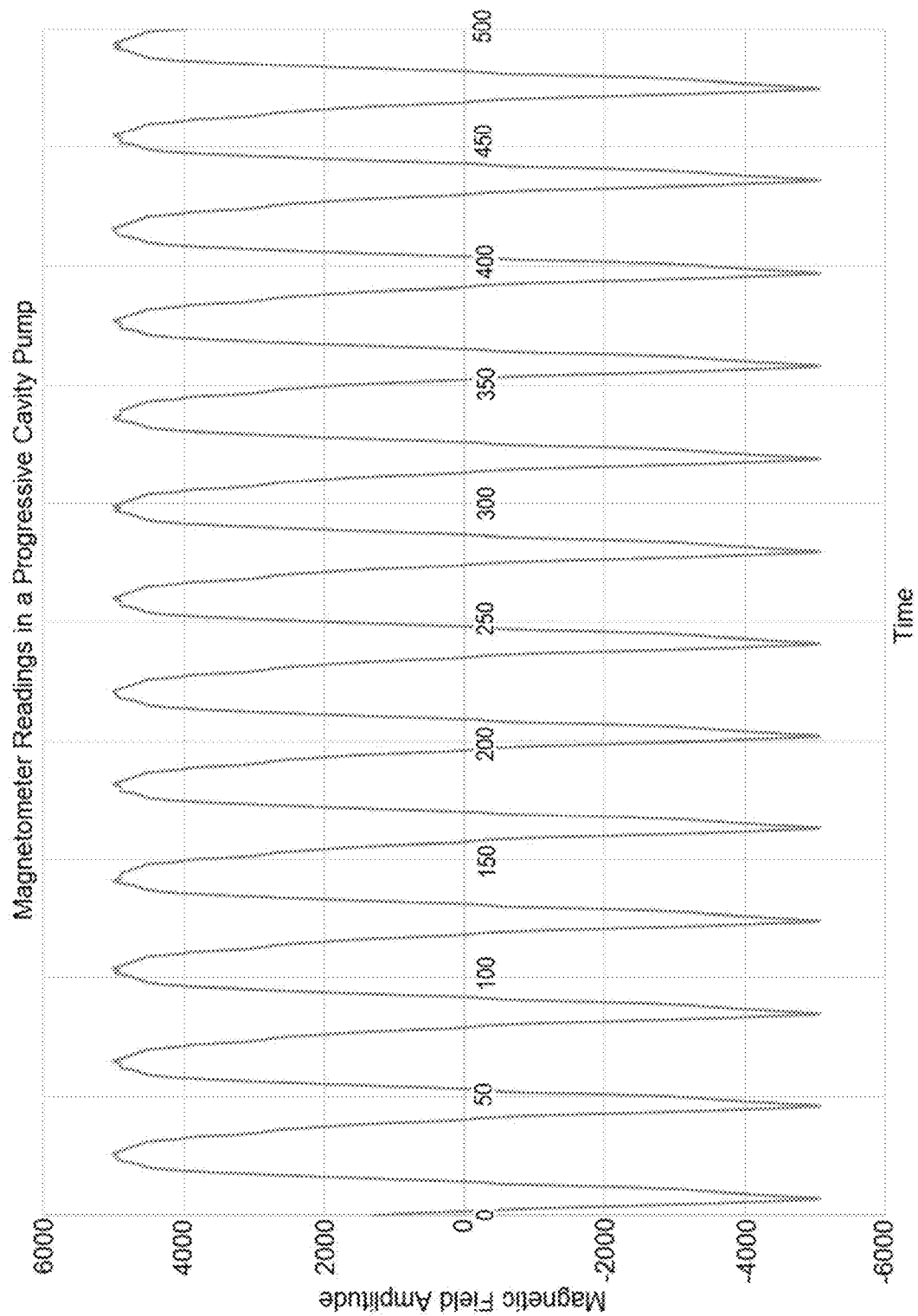
FIG. 8 is a graph showing a representative display of magnetic field readings in a PCP in which wobble is occurring.

Rotor 25 may be off center within stator 20, leading to inefficiencies. "Wobble" occurs when the center of the drive rod creates a circular path during each rod rotation. The amplitude of the magnetometer readings is proportional to the size of the circular path and is thus a characteristic of whether, and if so, how much the rotor 25 is off center. An example of magnetic field readings when wobble is occurring is shown in FIG. 8, and is represented as a "U" or "inverted U" inverted shape.

Figure 6:
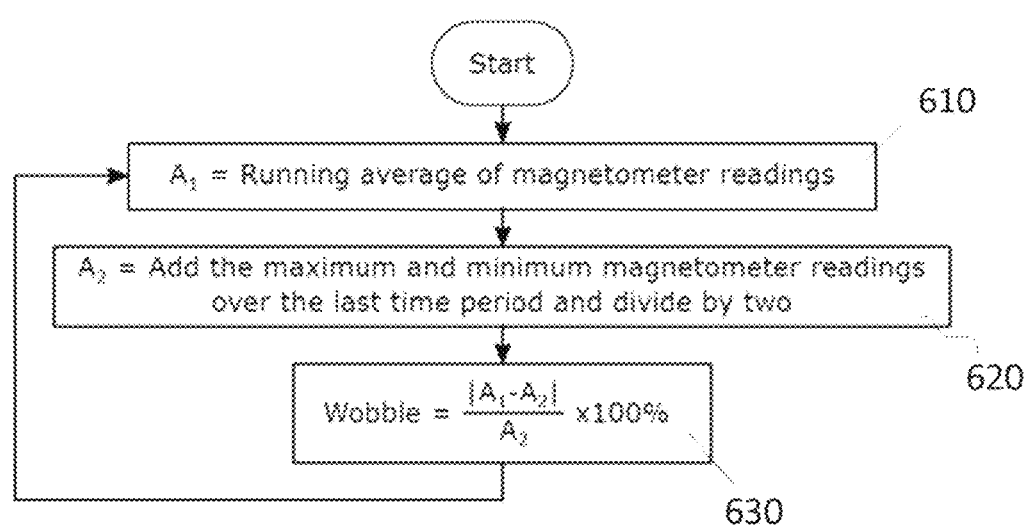
FIG. 6 is a flow chart showing an embodiment of the determination of a wobble value.

A first simple embodiment of a method of calculating wobble of a PCP is shown in FIG. 6. According to this embodiment, a running average of the amplitude of the magnetic field readings is taken (step 610), referred to as $A_1$. The maximum and minimum magnetic field readings over a previous time period are then summed and divided by two, i.e. averaged (step 620), referred to as $A_2$. A wobble value is then calculated by taking the absolute value of $A_1-A_2$, the result of which is divided by $A_2$, which is then multiplied by 100 to obtain a percentage (step 630), representing a wobble value.

Figure 7:
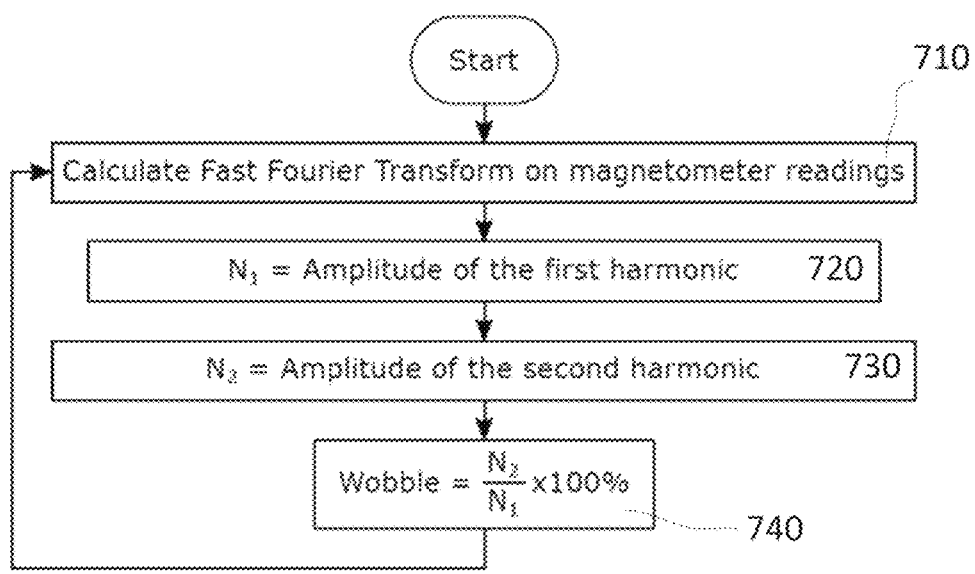
FIG. 7 is a flow chart showing an alternative embodiment of a wobble value.

A second embodiment of a method of calculating wobble is shown in FIG. 7. In this embodiment, a fast Fourier transform is performed on the magnetic field readings (step 710). The amplitude of the first harmonic is set to $N_1$ (step 720) and the amplitude of the second, following harmonic is set to $N_2$ (step 730). A wobble is then calculated as $N_2$ divided by $N_1$, which is converted to a percentage by multiplying by 100. Other mathematical means of calculating wobble based on the "U" or "inverted U" shape of the magnetic field readings may be used.

The computed wobble values can be displayed, stored, sent to a SCADA system or used to control the pump and can be combined with other values and sensor readings to provide a more complete picture of the performance of the PCP pump.

Cogging

Figure 10:
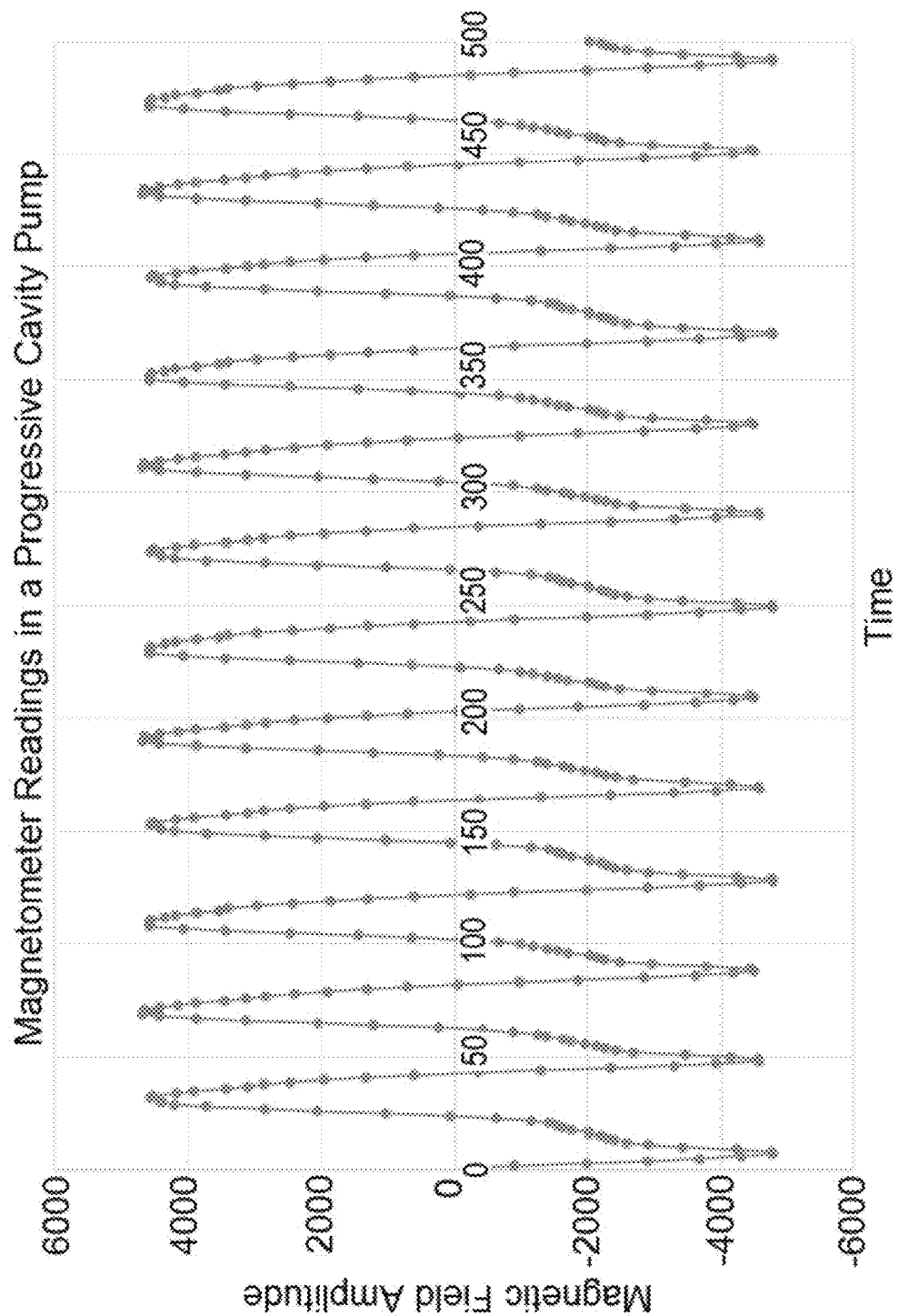
FIG. 10 is a graph showing a representative display of magnetic field readings in a PCP in which coming is occurring.

Cogging is a characteristic of rotor 25 that occurs when the rate of rotation varies within a single rotation of rotor 25, and indicates an inefficient pump. FIG. 10 displays an example of magnetic field readings when cogging is occurring, as can be seen in the saw tooth shape of the displayed waveform, which can be seen when cogging is taking place.

Figure 9:
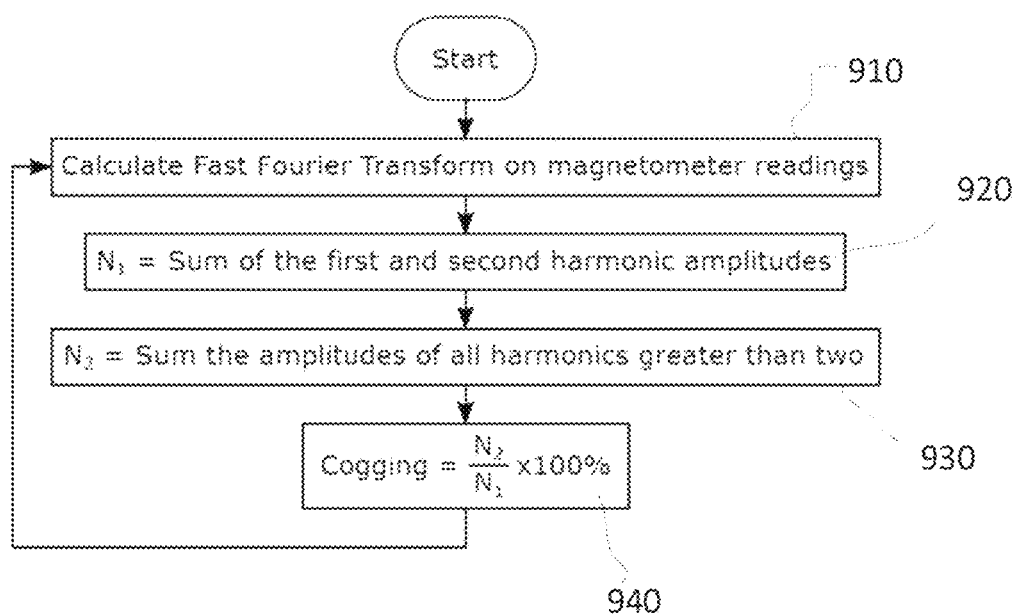
FIG. 9 is a flow chart showing an embodiment of a determination of a cogging value.

An embodiment of a method of calculating cogging is shown in FIG. 9. A fast Fourier transform is performed on the magnetic field readings (step 910). The sum of the first and second harmonic amplitudes is set at $N_1$ (step 920). The sum of all harmonics greater than two is set as $N_2$ (step 930). The cogging value is then determined as $N_2$ divided by $N_1$ multiplied by 100.

An alternative embodiment of the above described method of calculating cogging. Which would help eliminate the effects of noise, is to use the sum of even harmonics greater than two (instead of the sum of all harmonics) to determine $N_2$, and bypassing the odd harmonics (or alternatively, using the sum of odd harmonics greater than two). Other embodiments include taking the sum of every fourth or sixth harmonics greater than 2 to determine $N_2$ instead of the sum of all harmonics. Alternatively, other methods of calculating cogging could be used that represent mathematical representations of the saw tooth waveform.

The computed cogging values can be displayed, stored, sent to a SCADA system or used to control the pump and can be combined with other values and sensor readings to provide a more complete picture of the performance of the PCP pump.

Surface Based Sensors

As described earlier sensor assembly 45 may be positioned at the surface, and can take the same measurements as described above to determine cogging, wobble, and stick and slip, as well as RPM, vibration, acceleration, temperature, and pressure. Distance to the magnet can be used to calculate rod height, as described below. Additional sensors at the surface can be added to measure fluid flow, torque, weight on the rods, and motor parameters, such as frequency, current and voltage. A surface based sensor would similarly to a downhole magnetic field sensor, measuring the magnetic field generated by a magnet positioned on rod 15.

Rod height is normally measured with tape but could be measured by sensors positioned at the surface. The rod height measurement is useful for making adjustments to the rod height to provide optimal positioning of the rotor (which can be determined by downhole sensors). In an embodiment of the invention the rod height can be automatically adjusted based on the sensor readings from the surface and downhole sensors.

Surface sensors can also measure torque and rod weight, either directly, for example by using strain gauges, or indirectly, for example by calculating from other measurements like motor current and pressures.

Further and in addition to the disclosure provided above, it will be readily apparent to one of ordinary skill in the art that the various processes and methods described herein may be implemented by, e.g., appropriately programmed general purpose computer systems, special purpose computer systems and computing devices. Typically a processor (e.g., one or more microprocessors, one or more microcontrollers, one or more digital signal processors) will receive instructions (e.g., from a memory or like device), and execute those instructions, thereby performing one or more processes defined by those instructions. Instructions may be embodied in, e.g., a computer program.

A "processor" means one or more microprocessors, central processing units (CPUs), computing devices, microcontrollers, digital signal processors, or like devices or any combination thereof.

Thus a description of a process is likewise a description of an apparatus for performing the process. The apparatus that performs the process can include, e.g., a processor and those input devices and output devices that are appropriate to perform the process.

Further, programs that implement such methods (as well as other types of data) may be stored and transmitted using a variety of media (e.g., computer readable media) in a number of manners. In some embodiments, hard-wired circuitry or custom hardware may be used in place of, or in combination with, some or all of the software instructions that can implement the processes of various embodiments. Thus, various combinations of hardware and software may be used instead of software only.

The term "computer-readable medium" refers to any medium, a plurality of the same, or a combination of different media that participate in providing data (e.g., instructions, data structures) which may be read by a computer, a processor or a like device. Such a medium, may take many forms, including but not limited to, non-volatile media, volatile media, and transmission media. Non-volatile media include, for example, optical or magnetic disks and other persistent memory. Volatile media include dynamic random access memory (DRAM), which typically constitutes the main memory. Transmission media include coaxial cables, copper wire and fiber optics, including the wires that comprise a system bus coupled to the processor. Transmission media may include or convey acoustic waves, light waves and electromagnetic emissions, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, an EPROM, a FLASH-EEPROM, any other memory chip or cartridge, a carrier wave as described hereinafter, or any other medium from which a computer can read.

Various forms of computer readable media may be involved in carrying data (e.g. sequences of instructions) to a processor. For example, data may be (i) delivered from RAM to a processor; (ii) carried over a wireless transmission medium; (iii) formatted and/or transmitted according to numerous formats, standards or protocols, such as Ethernet (or IEEE 802.3), SAP, ATP, Bluetooth M., and TCP/IP, TDMA, CDMA, and 3G; and/or (iv) encrypted to ensure privacy or prevent fraud in any of a variety of ways well known in the art.

Thus a description of a process is likewise a description of a computer-readable medium storing a program for performing the process. The computer-readable medium can store (in any appropriate format) those program elements which are appropriate to perform the method.

Just as the description of various steps in a process does not indicate that all the described steps are required, embodiments of an apparatus include a computer/computing device operable to perform some (but not necessarily all) of the described process.

Likewise, just as the description of various steps in a process does not indicate that all the described steps are required, embodiments of a computer-readable medium storing a program or data structure include a computer-readable medium storing a program that, when executed, can cause a processor to perform some (but not necessarily all) of the described process.

As will be apparent to those skilled in the art, the various embodiments described above can be combined to provide further embodiments Aspects of the present systems, methods and components can be modified, if necessary, to employ systems, methods, components and concepts to provide yet further embodiments of the invention. For example, the various methods described above may omit some acts, include other acts, and/or execute acts in a different order than set out in the illustrated embodiments. For example the methods described above are intended to provide models corresponding to the data provided by the magnetic field readings occurring when the pump has certain characteristics, and alternative methods could be used to correspond to such data.

The present methods, systems and articles also may be implemented as a computer program product that comprises a computer program mechanism embedded in a computer readable storage medium. For instance, the computer program product could contain program modules. These program modules may be stored on CD-ROM, DVD, magnetic disk storage product, flash media or any other computer readable data or program storage product. The software modules in the computer program product may also be distributed electronically, via the Internet or otherwise, by transmission of a data signal (in which the software modules are embedded) such as embodied in a carrier wave and transmission type media such as digital and analog communication links using TDM or IP based communication links (e.g., packet links).

For instance, the foregoing detailed description has set forth various embodiments of the devices and/or processes via the use of examples. Insofar as such examples contain one or more functions and/or operations, it will be understood by those skilled in the art that each function and/or operation within such examples can be implemented, individually and/or collectively, by a wide range of hardware, software, firmware, or virtually any combination thereof. In one embodiment, the present subject matter may be implemented via ASICs. However, those skilled in the art will recognize that the embodiments disclosed herein, in whole or in part, can be equivalently implemented in standard integrated circuits, as one or more computer programs running on one or more computer systems (e.g., as one or more programs running on one or more computer systems), as one or more programs running on one or more controllers (e.g., microcontrollers) as one or more programs running on one or more processors (e.g., microprocessors), as firmware, or as virtually any combination thereof and that designing the circuitry and/or writing the code for the software and or firmware would be well within the skill of one of ordinary skill in the art in light of this disclosure.

We claim:

1. A system for monitoring a downhole pump positioned within a well and comprising a stator positioned inside a tubing, and a rod fixed to a rotor and operable to rotate the rotor within the stator, the system comprising:
    a magnet positioned downhole on the rod above the rotor, such that as the rod rotates, the magnet produces a magnetic field;
    a monitoring tool mounted downhole above the rotor, and comprising at least one analog output magnetic field sensor to detect and measure the magnetic field generated by the magnet as the rod rotates, the magnetic field sensor being connected to a computer system on the surface; and
    the computer system configured to use the magnetic field measurements to determine magnetic field readings and determine a characteristic of the downhole pump based on rotation of the rod, the characteristic comprising at least one of: stick or slip; differential twist; wobble; and cogging; rotation speed of the rotor; and a distance of the magnet to the analog output magnetic field sensor; and to use a continuous analog magnetic waveform from the analog output magnetic field sensor to determine at least one of: a noise level associated with the pump; and an occurrence of a destructive oscillation.

2. The system of claim 1 wherein the computer system is further configured to calculate a twist value by comparing a number of rotor revolutions to a number of surface rotations over a time period.

3. The system of claim 1 further comprising:
    a pressure sensor;
    a temperature sensor; and
    an accelerometer;
wherein the characteristic is used with the output from the pressure sensor, temperature sensor, and accelerometer to provide a pump condition value.

4. The system of claim 1 wherein the computer system is configured to display, on a graphical display, a difference signal comprising a waveform of the magnetic field compared to a perfect sine wave.

5. The system of claim 1, further comprising a sensor configured to determine rod height, the sensor configured to determine rod height positioned at the surface.

* * * * *